(12) United States Patent
Baldwin et al.

(10) Patent No.: US 7,516,037 B2
(45) Date of Patent: Apr. 7, 2009

(54) METHOD EVALUATING THRESHOLD LEVEL OF A DATA CELL IN A MEMORY DEVICE

(75) Inventors: David John Baldwin, Allen, TX (US); Eric Blackall, Dallas, TX (US); Joseph Devore, Richardson, TX (US); Ross E. Teggatz, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/755,891

(22) Filed: May 31, 2007

(65) Prior Publication Data
US 2007/0240026 A1 Oct. 11, 2007

Related U.S. Application Data

(62) Division of application No. 11/139,172, filed on May 28, 2005, now Pat. No. 7,269,528.

(51) Int. Cl.
*G06F 15/00* (2006.01)
(52) U.S. Cl. .............. 702/117; 714/7; 714/8; 714/42; 714/54; 700/5; 324/500; 324/512; 324/522; 324/523; 324/537; 324/765; 324/769

(58) Field of Classification Search ............... 702/117; 714/7–8, 42, 54; 700/5; 324/500, 512, 522, 324/523, 765, 769
See application file for complete search history.

(56) References Cited

U.S. PATENT DOCUMENTS 5,526,445 A * 6/1996 Smutek et al. ............ 382/237

* cited by examiner

*Primary Examiner*—Tung S Lau
*Assistant Examiner*—Sujoy K Kundu
(74) *Attorney, Agent, or Firm*—Jacqueline J. Garner; W. James Brady, III; Frederick J. Telecky, Jr.

(57) ABSTRACT

A method evaluating threshold of a data cell in a memory device including a programming locus coupled with the data cell for receiving a programming signal setting a stored signal level in the data cell and responding to a read signal to indicate the stored signal at a read locus; includes the steps of: (a) in no particular order; (1) selecting a test threshold signal; and (2) setting a read signal at a non-read level; (b) applying the test threshold signal to the programming locus; (c) cycling the read signal between a read level and a non-read level while applying the test threshold signal to the programming locus to present at least two test signals at the read locus when the read signal is at the read level; and (d) while cycling, observing whether the at least two test signals manifest a difference greater than a predetermined amount.

1 Claim, 2 Drawing Sheets

US 7,516,037 B2

METHOD EVALUATING THRESHOLD LEVEL OF A DATA CELL IN A MEMORY DEVICE

This is a divisional application of Ser. No. 11/139,172 file May 28, 2005, now U.S. Pat. No. 7,269,528.

BACKGROUND OF THE INVENTION

The present invention is directed to electrical memory devices. By way of example and not by way of limitation, the present invention is advantageously employed with EEPROM (Electronically Erasable Programmable Read Only Memory) devices, apparatuses or products.

Electrical memory devices, such as EEPROMs, are commonly used to store data in digital form. In mixed signal circuitry (e.g., circuitry containing digital circuit sections and analog circuit sections) such electrical memory elements or storage elements may be used to store information that is used to trim analog circuits or to calibrate sensor elements interfacing with a circuit. The electrical memory devices are therefore critical to the proper operation of circuits containing them, including digital circuits, analog circuits and mixed circuits so that electrical memory devices must reliably retain their programmed states over the lifetime of a product containing them.

There is a need for a method by which a manufacturer can verify that an electrical memory device is configured to properly retain a programmed state before shipping the device to a customer.

Because die space is such a premium in today's smaller, faster products, it is preferred that such a method for verification minimally affect die area for its implementation and practice.

SUMMARY OF THE INVENTION

A method evaluating threshold of a data cell in a memory device including a programming locus coupled with the data cell for receiving a programming signal setting a stored signal level in the data cell and responding to a read signal to indicate the stored signal at a read locus; includes the steps of: (a) in no particular order: (1) selecting a test threshold signal; and (2) setting a read signal at a non-read level; (b) applying the test threshold signal to the programming locus; (c) cycling the read signal between a read level and a non-read level while applying the test threshold signal to the programming locus to present at least two test signals at the read locus when the read signal is at the read level; and (d) while cycling, observing whether the at least two test signals manifest a difference greater than a predetermined amount.

It is, therefore, an object of the present invention to provide a method by which a manufacturer can verify that an electrical memory device is configured to properly retain a programmed state before shipping the device to a customer.

It is a further object of the present invention to provide a method by which a manufacturer can verify that an electrical memory device is configured to properly retain a programmed state that minimally affects die area for its implementation and practice.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
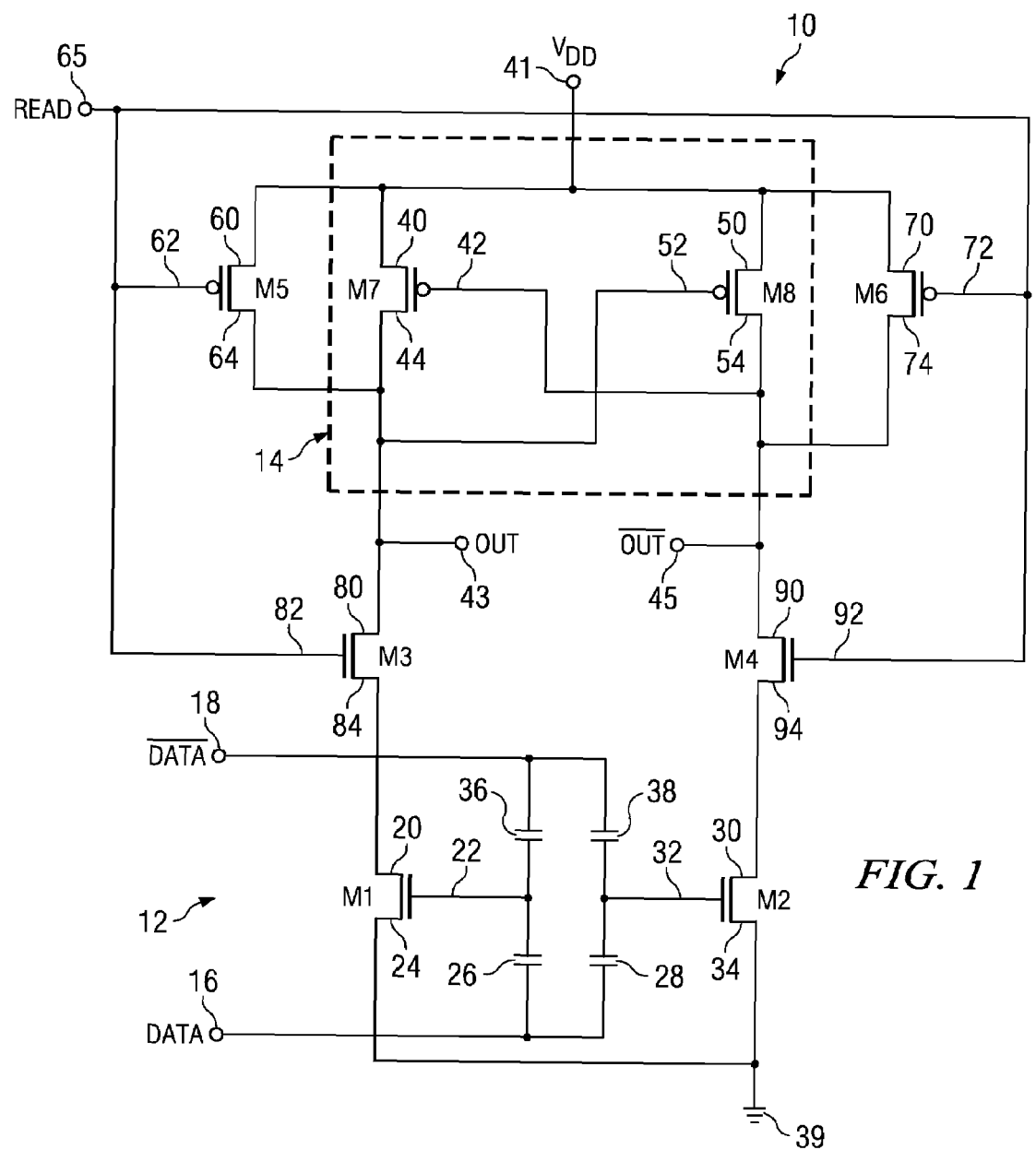
FIG. 1 is an electrical schematic diagram illustrating a representative differential data element in an EEPROM device.

FIG. 1 is an electrical schematic diagram illustrating a representative differential data element in an EEPROM device. In FIG. 1, an electrical memory storage device 10 is representative of a single data element in an array of data elements (not shown in FIG. 1) in, by way of example and not by way of limitation, an EEPROM (Electronically Erasable Programmable Read Only Memory) apparatus or product. Memory storage device 10 includes a data cell 12 and a latch 14.

Data cell 12 includes NMOS transistors M1, M2 coupled in parallel. Transistor M1 has a source 20, a gate 22 and a drain 24. Transistor M2 has a source 30, a gate 32 and a drain 34. Drains 24, 34 are coupled with a ground 39. Programming loci 16, 18 receive programming signals. Programming locus 16 receives programming signal DATA. Programming locus 18 receives programming signal $\overline{DATA}$, or "not DATA". Programming signal DATA is delivered to gates 22, 32 via capacitors 26, 28. Programming signal $\overline{DATA}$ is delivered to gates 22, 32 via capacitors 36, 38. In the illustrative embodiment of memory storage device 10 presented in FIG. 1, capacitor 26 has much greater capacitance than capacitor 36, and capacitor 38 has much greater capacitance than capacitor 28. Because impedance of a capacitor is inversely proportional to capacitance, the capacitance mismatch in respective capacitor pairs 26, 36 and 28, 38 will present substantially all of programming signal DATA to gate 32 and will present substantially all of programming signal $\overline{DATA}$ to gate 22. When programming signals DATA, $\overline{DATA}$ are applied to programming loci 16, 18 data cell 12 is programmed in a differential fashion understood by those skilled in the art.

Latch 14 includes PMOS transistors M7, M8 coupled between a voltage supply locus 41 and output loci 43, 45. Transistor M7 has a source 40, a gate 42 and a drain 44. Transistor M8 has a source 50, a gate 52 and a drain 54. Sources 40, 50 are coupled with voltage supply locus 41 and receive a supply voltage $V_{DD}$ from voltage supply locus 41. Gate 42 is cross-coupled with drain 54. Gate 52 is cross-coupled with drain 44. Drain 44 is coupled with output locus 43. Drain 54 is coupled with output locus 45. PMOS transistors M5, M6 are coupled with transistors M7, M8. Transistor M5 has a source 60 coupled with source 40 of transistor M7 and with voltage supply locus 41, a gate 62 coupled to receive a READ signal from a read signal input locus 65, and a drain 64 coupled with drain 44. Transistor M6 has a source 70 coupled with source 50 of transistor M8 and with voltage supply locus 41, a gate 72 coupled to receive a READ signal from read signal input locus 65, and a drain 74 coupled with drain 44.

An NMOS transistor M3 has a source 80 coupled with drain 44, a gate 82 coupled with read signal input locus 65 and a drain 84 coupled with source 20. An NMOS transistor M4 has a source 90 coupled with drain 54, a gate 92 coupled with read signal input locus 65 and a drain 94 coupled with source 30.

When read signal READ is high, transistors M3, M4 are turned on and data cell 12 is coupled with latch 14. Latch 14 and data cell 12 cooperate to present output signals OUT, $\overline{\text{OUT}}$ at output loci 43, 45. When read signal READ is low, transistors M3, M4 are off and data cell 12 may be programmed for later reading when read signal READ goes high again. When read signal READ is low, transistors M5, M6 cooperate to keep both sides of latch 14 (i.e., output loci 43, 45) at voltage $V_{DD}$.

To program data cell 12, by way of example and not by way of limitation, one of programming loci 16, 18 is grounded and a high programming voltage is applied to the non-grounded programming locus 16, 18. By way of further example and not by way of limitation, in a 5 volt logic system with $V_{DD}$ at 5 volts one may apply a programming voltage of 20 volts to programming locus 18. The programming of data cell 12 depends upon threshold values of transistors M1, M2 to ensure that the voltages present at gates 22, 32 are not bled off or otherwise dissipated over time. That is, the programmed voltages established at gates 22, 32 must remain substantially constant to ensure that memory storage device 10 will provide proper output signals OUT, $\overline{\text{OUT}}$ at output loci 43, 45 when read signal READ goes high.

By way of example and not by way of limitation, a 5 volt logic system programmed using a 20 volt programming signal may establish a voltage level of approximately 4 volts at one or both of gates 22, 32. An EEPROM or similar memory product may contain several thousand or more memory storage devices similar to memory storage device 10. Defects may occur that reduce the capability of a particular transistor M1, M2 in a particular memory storage device 10 in an EEPROM or similar product to maintain a charge of a particular level over time. Examples of such defects may include, by way of example and not by way of limitation, oxide deposition defects in gates 22, 32 or in one or more of capacitors 26, 28, 36, 38. It would be useful to be able to test an EEPROM or similar product to evaluate the capability of the product to properly indicate stored values with reduced thresholds available at gages 22, 32. That is, it would be useful to evaluate whether, in the event that thresholds of gates 22, 32 are reduced from a design threshold to a particular (test) threshold level, memory storage device 10 will still indicate correct output signals OUT, $\overline{\text{OUT}}$ at output loci 43, 45.

Memory storage device 10 may be tested vis-à-vis test thresholds less than design thresholds by applying a reduced threshold level signal at programming loci 16, 18. By way of example and not by way of limitation, one may effect a first observation of output signal OUT while no test signal is applied to programming loci 16, 18 (that is, DATA $\overline{\text{DATA}}$=0) and read signal READ is high. A second test level of test level signal of 2 volts (recall, as illustratively described above, the design threshold is 4 volts) to programming locus 18 while grounding programming locus 16 and while read signal READ is high, then read signal READ is cycled low and then read signal READ is reasserted high. A second reading of output signal DATA is then observed. If memory storage device 10 is operating properly at the extant test threshold voltage (i.e., in this example, 2 volts), the values of output signal OUT will be substantially unchanged for the first and second observations. That is, when values of output signal $\overline{\text{OUT}}$ will be substantially unchanged for the first and second observations one can infer that the programming charge at gates 22, 32 is greater than the test value (in this example the test value is 2 volts).

Then read signal READ may again cycled low and reasserted high. A third reading of output signal OUT may then be observed. If memory storage device 10 is operating properly at the extant test threshold voltage (i.e., in this example, 2 volts), the values of output signal OUT will be substantially unchanged for the first, second and third observations.

As a further test to provide additional assurance of the accuracy of the test, by way of example and not by way of limitation, one may effect a first observation of output signal $\overline{\text{OUT}}$ while no test signal is applied to programming loci 16, 18 (that is, DATA-$\overline{\text{DATA}}$=0) and read signal READ is high. A second test level of test level signal of 2 volts (recall, as illustratively described above, the design threshold is 4 volts) to programming locus 16 while grounding programming locus 18 and while read signal READ is high, then read signal READ is cycled low and then read signal READ is reasserted high. A second reading of output signal $\overline{\text{OUT}}$ may then be observed. If memory storage device 10 is operating properly at the extant test threshold voltage (i.e., in this example, 2 volts), the values of output signal $\overline{\text{OUT}}$ will be substantially unchanged for the first and second observations. That is, when values of output signal $\overline{\text{OUT}}$ will be substantially unchanged for the first and second observations one can infer that the programming charge at gates 22, 32 is greater than the test value (in this example the test value is 2 volts).

Then read signal READ may again cycled low and reasserted high. A third reading of output signal $\overline{\text{OUT}}$ may then be observed. If memory storage device 10 is operating properly at the extant test threshold voltage (i.e., in this example, 2 volts), the values of output signal $\overline{\text{OUT}}$ will be substantially unchanged for the first, second and third observations.

Note that the first, second and third observations of an output signal (either output signal OUT or output signal $\overline{\text{OUT}}$) are only made after read signal READ is asserted from low to high. That is, the three readings are made with programming signals DATA, $\overline{\text{DATA}}$ in the states of "00", "01", and "10", but not when both programming signals DATA, $\overline{\text{DATA}}$ are in a "1" state, where "1" represents a test voltage being applied, and "0" represents ground in this exemplary case.

Implementing the test of the present invention may be effected to verify that the threshold of transistors M1, M2 are sufficiently programmed at the reduced test voltage level to assure that data cell 12 will be capable of holding its programmed value over the life of the product containing memory storage device 10. Importantly, the test of the present invention may be implemented without requiring additional circuitry or having another impact upon die space required for configuring memory storage device 10.

Figure 2:
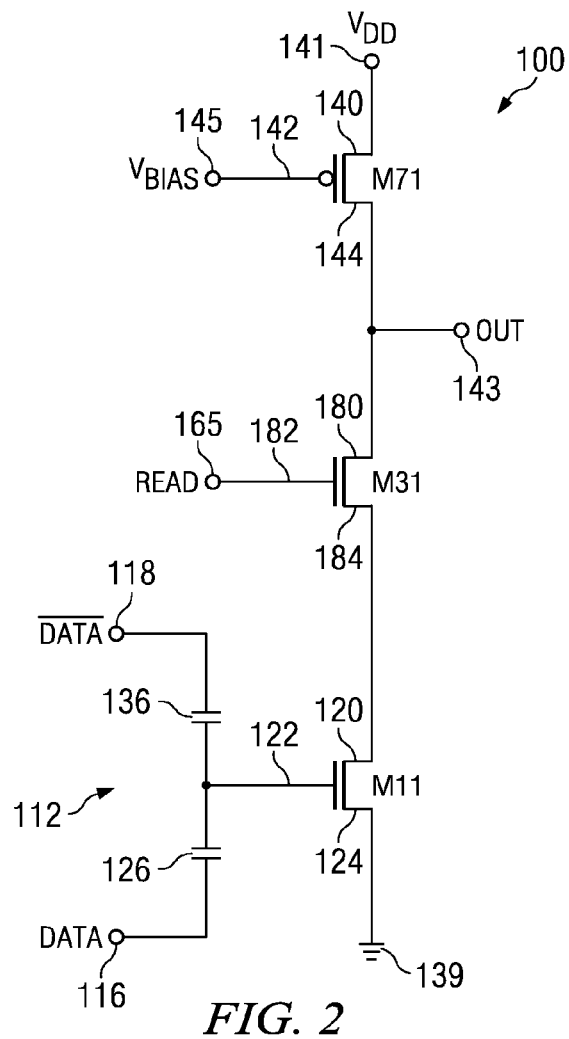
FIG. 2 is an electrical schematic diagram illustrating a representative non-differential data element in an EEPROM device.

FIG. 2 is an electrical schematic diagram illustrating a representative non-differential data element in an EEPROM device. In FIG. 2, an electrical memory storage device 100 is representative of a single data element in an array of data elements (not shown in FIG. 2) in, by way of example and not by way of limitation, an EEPROM (Electronically Erasable Programmable Read Only Memory) apparatus or product. Memory storage device 100 includes a data cell 112.

Data cell 112 is embodied in an NMOS transistor M11. Transistor M11 has a source 120, a gate 122 and a drain 124. Drain 124 is coupled with a ground 139. Programming loci 116, 118 receive programming signals. Programming locus 116 receives programming signal DATA. Programming locus 118 receives programming signal $\overline{\text{DATA}}$ ("not DATA") or -DATA. Providing memory storage device 100 with a capability to receive both programming signals DATA, $\overline{\text{DATA}}$ (or -DATA) permits memory storage device 100 to be programmed with either a positive or a negative indication of a "1". One of programming signals DATA, $\overline{\text{DATA}}$ is delivered to gate 122 via capacitors 126, 136. In the illustrative embodiment of memory storage device 100 presented in FIG. 2, capacitor 126 has much greater capacitance than capacitor 136. Because impedance in a capacitor is inversely proportional to capacitance, the capacitance mismatch in capacitor pair 126, 136 will present substantially all of programming signal $\overline{\text{DATA}}$ to gate 122. When one of programming signals DATA, $\overline{\text{DATA}}$ is applied to one of programming loci 116, 118 and the other of programming loci 116, 118 is grounded, data cell 112 is programmed in a non-differential fashion understood by those skilled in the art.

PMOS transistor M71 is coupled between a voltage supply locus 141 and output locus 143. Transistor M71 has a source 140, a gate 142 and a drain 144. Source 140 is coupled with voltage supply locus 141 and receives a supply voltage $V_{DD}$ from voltage supply locus 141. Gate 142 is coupled with a bias locus 145 at which a bias voltage $V_{BIAS}$ is provided. Drain 144 is coupled with output locus 143.

An NMOS transistor M31 has a source 180 coupled with drain 144 of transistor M71, a gate 182 coupled with read signal input locus 165 and a drain 184 coupled with source 120 of transistor M11.

When read signal READ is high, transistor M31 is turned on and transistor M71 couples supply voltage locus 141 with transistor M11 if bias voltage $V_{BIAS}$ is appropriate to turn on transistor M7. Transistor M71 and transistor M11 cooperate to present output signal OUT output locus 143. When read signal READ is low, transistor M31 is off and transistor M11 may be programmed for later reading when read signal READ goes high again.

To program data cell 12 (i.e., transistor M11), by way of example and not by way of limitation, one of programming loci 116, 118 is grounded and a high programming voltage is applied to the non-grounded programming locus 116, 118. By way of further example and not by way of limitation, one may use a 5 volt logic system with $V_{DD}$ at 5 volts and apply a programming voltage of 20 volts to programming locus 118. The programming of data cell 112 depends upon threshold value of transistor M11 to ensure that the voltage present at gate 122 is not bled off or otherwise dissipated over time. That is, the programmed voltage established at gate 122 must remain substantially constant to ensure that memory storage device 100 will provide proper output signal OUT output locus 143 when read signal READ goes high.

By way of example and not by way of limitation, a 5 volt logic system programmed using a 20 volt programming signal will establish a voltage level at gate 122 of approximately 4 volts. An EEPROM or similar memory apparatus or product may contain several thousand or more memory storage devices similar to memory storage device 100. Defects may occur that reduce the capability of a particular transistor M11 in a particular memory storage device 100 in an EEPROM or similar apparatus or product to maintain a charge of a particular level over time. Examples of such defects may include, by way of example and not by way of limitation, oxide deposition defects in gate 122 or in one or more of capacitors 126, 136. It would be useful to be able to test an EEPROM or similar apparatus product to evaluate the capability of the apparatus or product to properly indicate stored values with a reduced threshold available at gate 122. That is, it would be useful to evaluate whether, in the event that threshold of gate 122 is reduced from a design threshold to a particular (test) threshold level over time or because of another reason, memory storage device 100 will still indicate correct output signal OUT output locus 143.

Memory storage device 100 may be tested vis-à-vis test thresholds less than design thresholds by applying a reduced threshold level signal at programming loci 116, 118. By way of example and not by way of limitation, one may effect a first observation of output signal OUT while no test signal is applied to programming loci 116, 118 (that is, DATA=$\overline{\text{DATA}}$=0) and read signal READ is high. A second test level of test level signal of 2 volts (recall, as illustratively described above, the design threshold is 4 volts) to programming locus 118 while grounding programming locus 116 and while read signal READ is high, then read signal READ is cycled low and then read signal READ is reasserted high. A second reading of output signal DATA is then observed. If memory storage device 100 is operating properly at the extant test threshold voltage (i.e., in this example, 2 volts), the values of output signal OUT will be substantially unchanged for the first and second observations. That is, when values of output signal OUT will be substantially unchanged for the first and second observations one can infer that the programming charge at gate 122 is greater than the test value (in this example the test value is 2 volts).

Then read signal READ may again cycled low and reasserted high. A third reading of output signal OUT may then be observed. If memory storage device 100 is operating properly at the extant test threshold voltage (i.e., in this example, 2 volts), the values of output signal OUT will be substantially unchanged for the first, second and third observations.

As a further test to provide additional assurance of the accuracy of the test, by way of example and not by way of limitation, one may effect a first observation of output signal OUT while no test signal is applied to programming loci 116, 118 (that is, DATA=$\overline{\text{DATA}}$=0) and read signal READ is high. A second test level of test level signal of 2 volts (recall, as illustratively described above, the design threshold is 4 volts) to programming locus 116 while grounding programming locus 118 and while read signal READ is high, then read signal READ is cycled low and then read signal READ is reasserted high. A second reading of output signal OUT may then be observed. If memory storage device 10 is operating properly at the extant test threshold voltage (i.e., in this example, 2 volts), the values of output signal OUT will be substantially unchanged for the first and second observations. That is, when values of output signal OUT will be substantially unchanged for the first and second observations one can infer that the programming charge at gate 122 is greater than the test value (in this example the test value is 2 volts).

Then read signal READ may again cycled low and reasserted high. A third reading of output signal OUT may then be observed. If memory storage device 100 is operating properly at the extant test threshold voltage (i.e., in this example, 2 volts), the values of output signal OUT will be substantially unchanged for the first, second and third observations.

Note that the first, second and third observations of an output signal OUT are only made after read signal READ is asserted from low to high. That is, the three readings are made with programming signals DATA, $\overline{\text{DATA}}$ in the states of "00", "01", and "10", but not when both programming signals DATA, DATA are in a "1" state, where "1" represents a test voltage being applied, and "0" represents ground in this exemplary case.

Implementing the test of the present invention may be effected to verify that the threshold of transistor M11 is sufficiently programmed at the reduced test voltage level to assure that data cell 112 will be capable of holding its programmed value over the life of the product containing memory storage device 100. Importantly, the test of the present invention may be implemented without requiring additional circuitry or other impact upon die space required for configuring memory storage device 100.

Memory storage device 100 may, alternatively, be configured without transistor M31. In such a configuration, bias signal $V_{BIAS}$ may be effectively used in lieu of a read signal. That is, bias signal $V_{BIAS}$ may be varied to render transistor M71 conductive or non-conductive, thereby controlling connection of voltage source locus 141 with transistor M11 and output locus 143.

The method of the present invention has been described in connection with FIGS. 1 and 2 as it may be employed to evaluate performance of a memory storage device at a given threshold level, i.e., a test threshold. Another useful employment of the method of the present invention is to evaluate a memory storage apparatus or product that incorporated a plurality of memory storage devices 10, 100 (FIGS. 1 and 2). By stepping the test threshold voltage value to successively lower voltage levels, one may use the method of the present invention to incrementally test a device, apparatus or product to ascertain the actual threshold value extant for individual data cells in a memory storage apparatus or product employing a plurality of memory storage devices 10, 100 (FIGS. 1 and 2). Further, by using such a stepwise variation of threshold test levels, one may employ the method of the present invention to evaluate an entire memory storage apparatus or product to learn whether threshold values of individual memory storage devices 10, 100 are dependent upon certain factors such as location in a layout, proximity to heat-producing components or other design or construction factors related to a product or apparatus that includes memory storage devices 10, 100.

Figure 3:
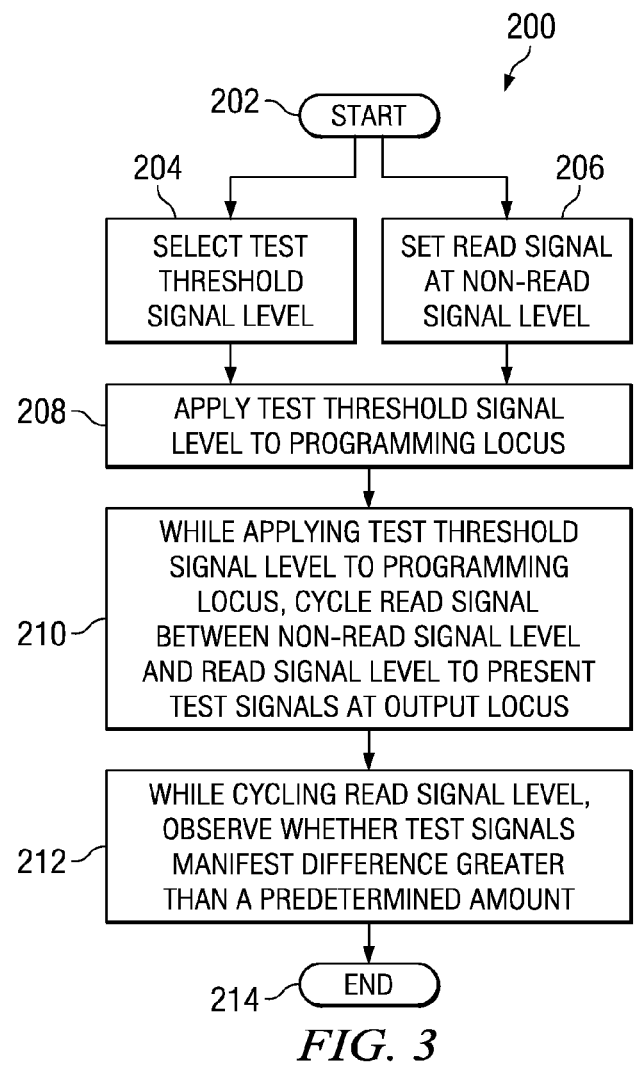
FIG. 3 is a flow diagram illustrating the method of the present invention.

FIG. 3 is a flow diagram illustrating the method of the present invention. In FIG. 3, a method 200 for evaluating a threshold level of a data cell structure in an electrical memory storage device begins at a START locus 202. The electrical memory storage device includes at least one programming locus coupled with the data cell structure for receiving at least one programming signal for setting a stored signal level in the data cell structure. The electrical memory storage device responds to a read signal at a predetermined read signal level to indicate the stored signal level in an output signal at a read output locus. Method 200 continues with, in no particular order: (1) selecting at least one test threshold signal level, as indicated by a block 204; and (2) setting the read signal at a non-read signal level other than the predetermined read signal level, as indicated by a block 206.

Method 200 continues with applying the at least one test threshold signal level to the at least one programming locus, as indicated by a block 208. Method 200 continues with effecting a cycling of the read signal between the non-read signal level and the predetermined read signal level while applying the at least one test threshold signal level to the at least one programming locus to present at least two test signals at the read output locus, as indicated by a block 210. While effecting the cycling, method 200 continues with observing whether the at least two test signals manifest a difference greater than a predetermined amount, as indicated by a block 212. Method 200 terminates at an END locus 214.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A method for evaluating a memory storage device, comprising the steps of:

applying a low READ signal to the memory storage device;

while applying said low READ signal to the memory storage device, applying a "0" to a programming node of the memory storage device;

while applying the "0" to a programming node of the memory storage device, applying a high READ signal to the memory storage device and measuring a first output voltage of the memory storage device;

applying the low READ signal to the memory storage device;

while applying said low READ signal to the memory storage device, applying a test signal to a programming node of the memory storage device, said test signal being less than a designed threshold level;

while applying the test signal to a programming node of the memory storage device, applying the high READ signal to the memory storage device and measuring a second output voltage of the memory storage device;

comparing said first output voltage to said second output voltage, wherein a difference between said first output voltage to said second output voltage less than a predetermined amount indicates proper configuration of the memory storage device.

* * * * *